United States Patent [19]
Mueller

[11] 3,934,244
[45] Jan. 20, 1976

[54] ALPHANUMERIC DISPLAY MEANS FOR COMPUTER-LINKED TYPEWRITER CONSOLES USING FLUORESCENT LUMINESCENT ALPHANUMERIC INDICATING MEANS

[75] Inventor: Thomas Delbert Mueller, Orinda, Calif.

[73] Assignee: Chevron Research Company, San Francisco, Calif.

[22] Filed: Nov. 5, 1973

[21] Appl. No.: 413,114

[52] U.S. Cl. ........ 340/324 R; 313/109.5; 340/365 R
[51] Int. Cl.[2] ......................................... G06F 3/14
[58] Field of Search ........... 340/324 R, 324 M, 378, 340/380, 166 EL, 365 R, 365 C; 313/109.5

[56] References Cited
UNITED STATES PATENTS

| | | | |
|---|---|---|---|
| 3,566,391 | 2/1971 | Lally | 340/166 EL |
| 3,670,322 | 6/1972 | Mallebrein | 340/365 C |

Primary Examiner—Marshall M. Curtis
Attorney, Agent, or Firm—R. L. Freeland, Jr.; H. D. Messner

[57] ABSTRACT

The present invention relates to an alphanumeric display unit means for improving the identification quantities at selected key buttons of a computer-linked typewriter console through usage of light-emitting indentification indicia attached adjacent to or at the selected key buttons. The light-emitting display means comprises a set of fluorescent luminescent alphanumeric display means each including a pair of side-by-side indicating units. The last-mentioned units are arranged so as to include an array of fluorescent segments formed on a common side of an insulating plate within a transparent envelope containing an ionizable gas. In operation, each pair of side-by-side indicating units is selectively activated by means of controller switch means connected thereto. Result: a luminescent two-character display in a fluorescent pattern of light corresponding to the alphanumeric indicia for which display is sought.

2 Claims, 8 Drawing Figures

ALPHANUMERIC DISPLAY MEANS FOR COMPUTER-LINKED TYPEWRITER CONSOLES USING FLUORESCENT LUMINESCENT ALPHANUMERIC INDICATING MEANS

FIELD OF THE INVENTION

The present invention relates to key-operated typographical machines such as typewriters and the like, and more particularly, to a computer-linked typewriter console used as an input/output (I/O) linkage for a general purpose digital computer.

BACKGROUND OF THE INVENTION

Today's different programming languages (FORTRAN, PL-1, ASSEMBLY, etc.) are often used interchangeably by operators at a common computer terminal for controlling a general purpose digital computer. The number, symbols and programming keys associated with a given programming language may require any one operator to alternate a plurality of fonts at the computer-linked typewriter console; however, as is well known, each font relates to a different layout of keyboard characters.

As font changes occur, it has been proposed to employ key buttons, each bearing a plurality of characters to aid the observer-user in more efficiently using the typewriter console. It has been further proposed to fit the key buttons with adjustable plates bearing different character indicia. However, where there are a plurality of operators-users at a common typewriter console such as found at most computer terminals, numerous alphanumeric identification plates would be needed. Therefore, the above-mentioned proposals have been found to be exceedingly awkward to implement. Also, in some cases it is desirable to "highlight" certain key buttons above those displayed at adjacent buttons owing to the importance of certain programming keys being implemented at the computer terminal. None of the prior art plates provides such features.

SUMMARY OF THE INVENTION

In accordance with the present invention, selected keyboard buttons of an I/O typewriter console linked to a general purpose digital computer are provided with a plurality of tightly fitting rigid tab frame means. Onto the frame means are fitted a highly visible, light-emitting alphanumeric display means for display of key alphanumeric indicia through selective control provided by controller switch means connected thereto. Preferably the light-emitting display means includes a pair of side-by-side indicator units. The pair of side-by-side units comprises an array of fluorescent segments formed on a side of a common insulated plate within a common envelope filled with an ionizable gas. The fluorescent segments form cathode elements that can be selectively activated on a time-share basis. Result: a light-emitting luminescent display in a fluorescent pattern corresponding to the alphanumeric indicia sought to be viewed by the observer-user.

OBJECTS OF THE INVENTION

An object of the present invention is the provision of a novel, light-emitting alphanumeric display for use at a typewriter console linked to a general purpose digital computer whereby the observer-user of the typewriter console can easily identify key lever operations irrespective of the number and/or programming language employed within the linked digital computer or at the I/O typewriter console itself.

Further objects of the invention will become apparent from a detailed description of the single embodiment given by way of example and not by way of limitation, reference being made to the accompanying drawings.

DESCRIPTION OF A DETAILED EMBODIMENT

Figure 1:
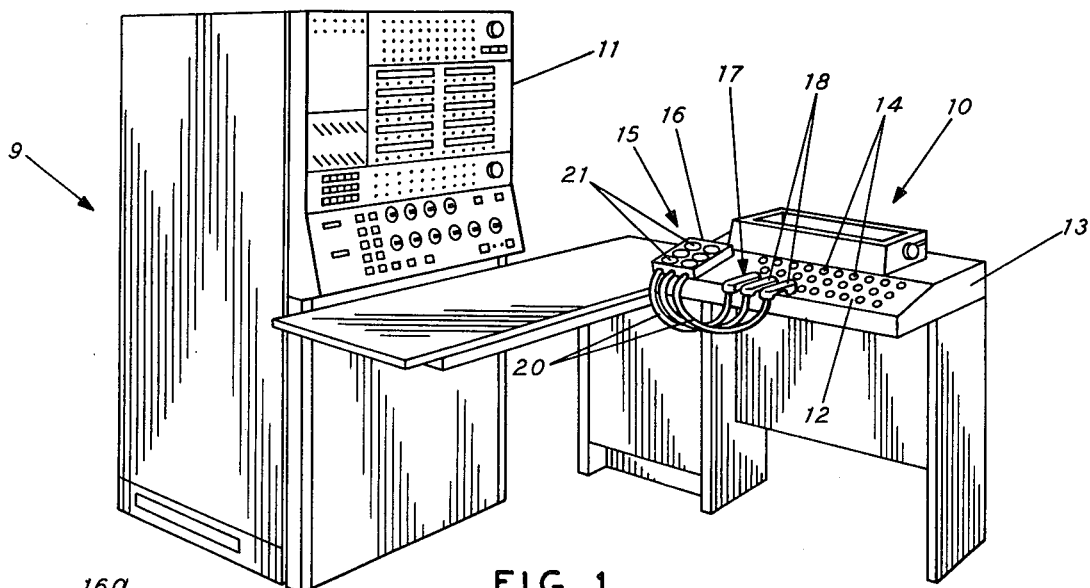
FIG. 1 is a perspective view of an I/O computer terminal which includes a typewriter console having a keyboard provided with light-emitting, alphanumeric character displays positioned at selected key buttons in accordance with the present invention.

FIG. 1 illustrates a computer terminal 9. The computer terminal 9 includes an I/O typewriter console 10 useful in linking digital information to a general purpose digital computer (not shown). Information can be linked to the computer by I/O devices other than the typewriter console 10. For this purpose, such associated I/O devices can be housed within cabinet 11.

Typewriter console 10 is seen to comprise a keyboard 12 visible above housing 13. The observer-user utilizes key buttons 14 to depress levers (not shown) by which conventional font-paper interaction occurs while, simultaneously, the data is transmitted to the general purpose digital computer. Keyboard 12 is conventionally arranged; e.g., as a series of rows and columns. Due to the fact that different programming languages used by various observer-users for computer control purposes may employ numerous characters, symbols and keys not readily interrelated, there is a definite need for identification means for attachment to selected key buttons 14. Preferably such identification means should "highlight" the display irrespective of the background lighting environment at the compupter terminal 9. The present invention provides for such a display through a novel, light-emitting display unit 15 attached to the typewriter console 10. In general, the display unit 15 comprises a controller switch unit 16 attached, say, to the housing 13 of the typewriter console 10, and an alphanumeric indicating unit 17 including a rigid frame means 18. Also of importance: transfer bundle means 20 connected between the controller switch unit 16 and the indicating unit 17. Each of the aforementioned elements will not be described in detail.

Controller Switch Unit 16

Figure 2:
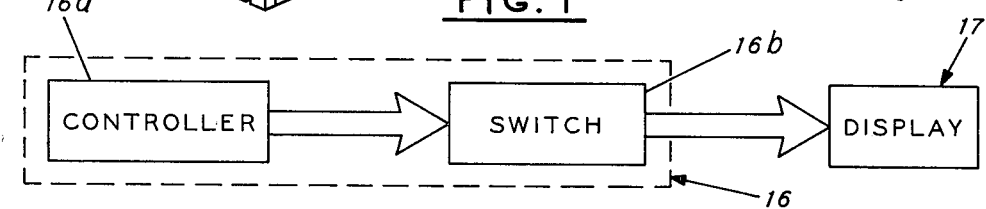
FIG. 2 is a schematic diagram of circuitry useful in the apparatus of the present invention.

As FIG. 1 illustrates, controller switch unit 16 should be placed within arm's length of an observer-user seated at the typewriter console 10. To the broad horizontal surface of the unit are attached a series of buttons 21. Purpose: to effectuate control of indicating means 17 through digital controller 16a (FIG. 2) operating in conjunction with switch unit 16a, as explained in detail below.

Figure 5:
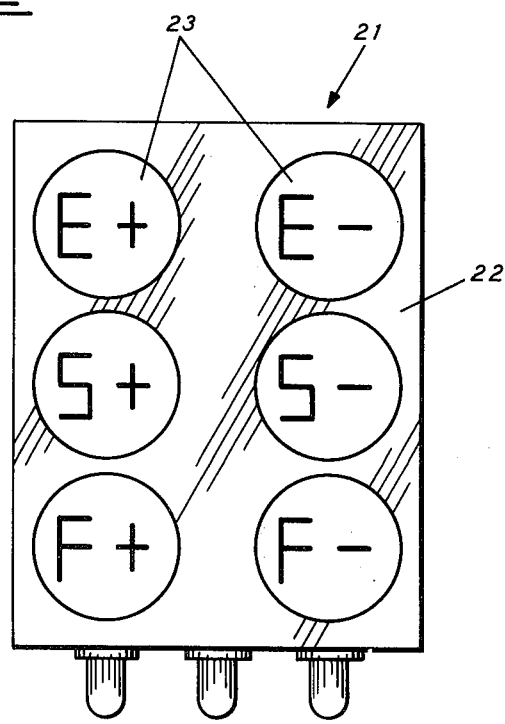
FIG. 5 is a plan view of an array of switch buttons useful in initializing circuit components within the apparatus of the present invention.

FIG. 5 illustrates the arrangement of buttons 21 in more detail. As shown, they are arranged as a matrix array comprising a series of orthogonal columns and rows extending well above the support housing 22. Tags 23 are attached to the upper broad surfaces of the buttons so as to allow easy identification to the observer-user. Operation of the buttons is straightforward: downward movement will cause switch elements (not shown) to change their operational state. As a result, initialization operations within the controller 16a, as discussed below, occur.

Figure 6:
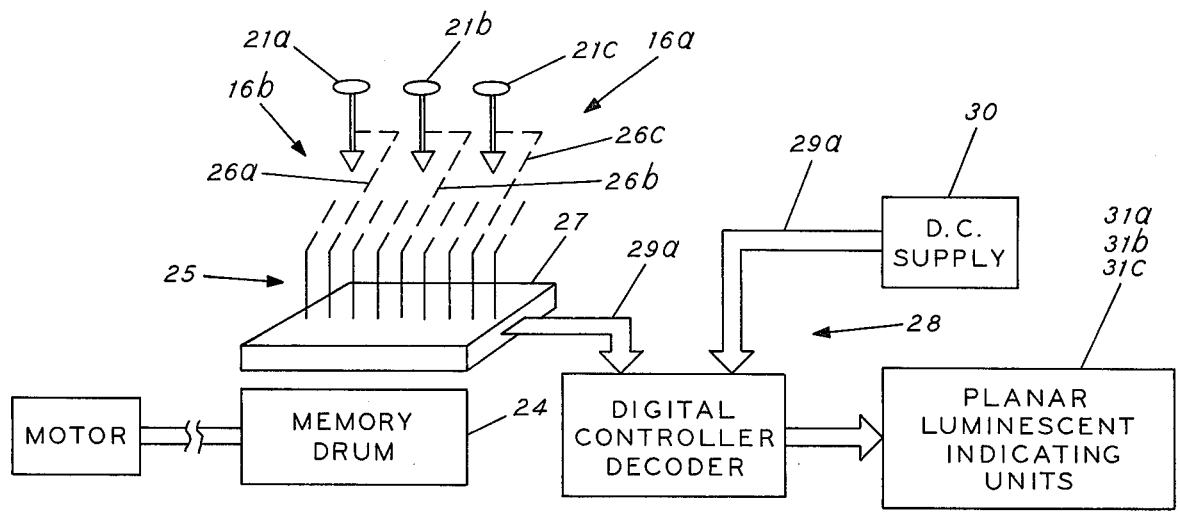
FIG. 6 is a schematic diagram of digital control circuitry useful in the present invention.
Figure 7:
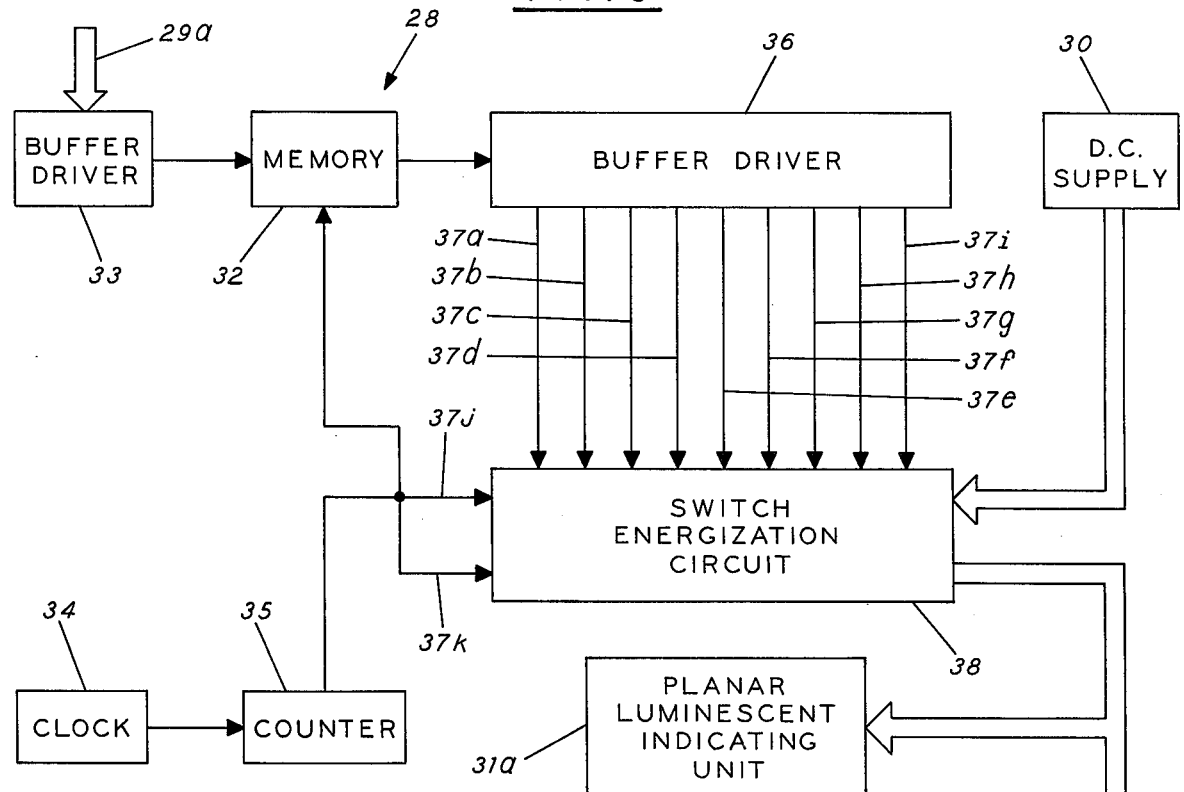
FIG. 7 is a detail schematic diagram of a digital controller-decoder useful in carrying out the present invention.

FIGS. 6 and 7 illustrate controller switch unit 16 in more detail.

With specific reference to FIG. 6, assume binary control-bit data has been encoded onto memory drum 24 as bit-channels, say under control of the buttons 21a, 21b and 21c in conjunction with read-write head unit 27.

Each bit-channel comprises a binary activation code of bit information associated with a selected button. For decoding purposes, assume that the buttons 21a, 21b and 21c have undergone downward movement so as to change status of switch elements generally indicated at 25 in FIG. 6 through operation of mechanical linkages 26a, 26b and 26c. As a result, three channels of binary data—initialization codes—to are read into digital controller-decoder 28 via transfer line 29a. Purpose of the initialization codes: to provide the digital controller-decoder 28 with switch control information by which luminscent display units 31a, 31b and 31c constituting the indicating unit 17 of FIG. 1 can be biased via transfer line 29b corrected to supply means 30.

FIG. 7 illustrates digital controller-decoder 28 in more detail.

As shown, the sets of initialization codes are read into memory unit 32 via the transfer line 29a through buffer driver 33. Synchronization signals are generated by master clock 34. In series with clock 34 is binary counter 35. Binary activation codes previously read into the memory unit 32 are sequentially fetched from the latter through command signals generated by clock 34 and counter 35 and pass through buffer-driver 36 to terminals 37a–37i, and thence to switch energization circuit 38. Timing signals are also seen to pass from the clock 34 and counter 35 to the switch energization circuit 38 via terminals 37j, 37k. Switch energization circuit 38 enables electronic switching elements as explained below, in a selected manner whereby luminescent discharge units 31a, 31b or 31c constituting indicator unit 17 can be biased by D.C. supply means 30 so as to provide a pattern of fluorescent light corresponding to the alphanumeric indicia for which display is sought. Since the liminescent discharge units 31a, 31b and 31c each include multi-elemented, individually controllable, display segments, the binary state (ONE ZERO) of the codes at each of the terminals 37a–37k can be used to alter display characteristics as explained in detail below.

Indicating Unit 17

Figure 8:
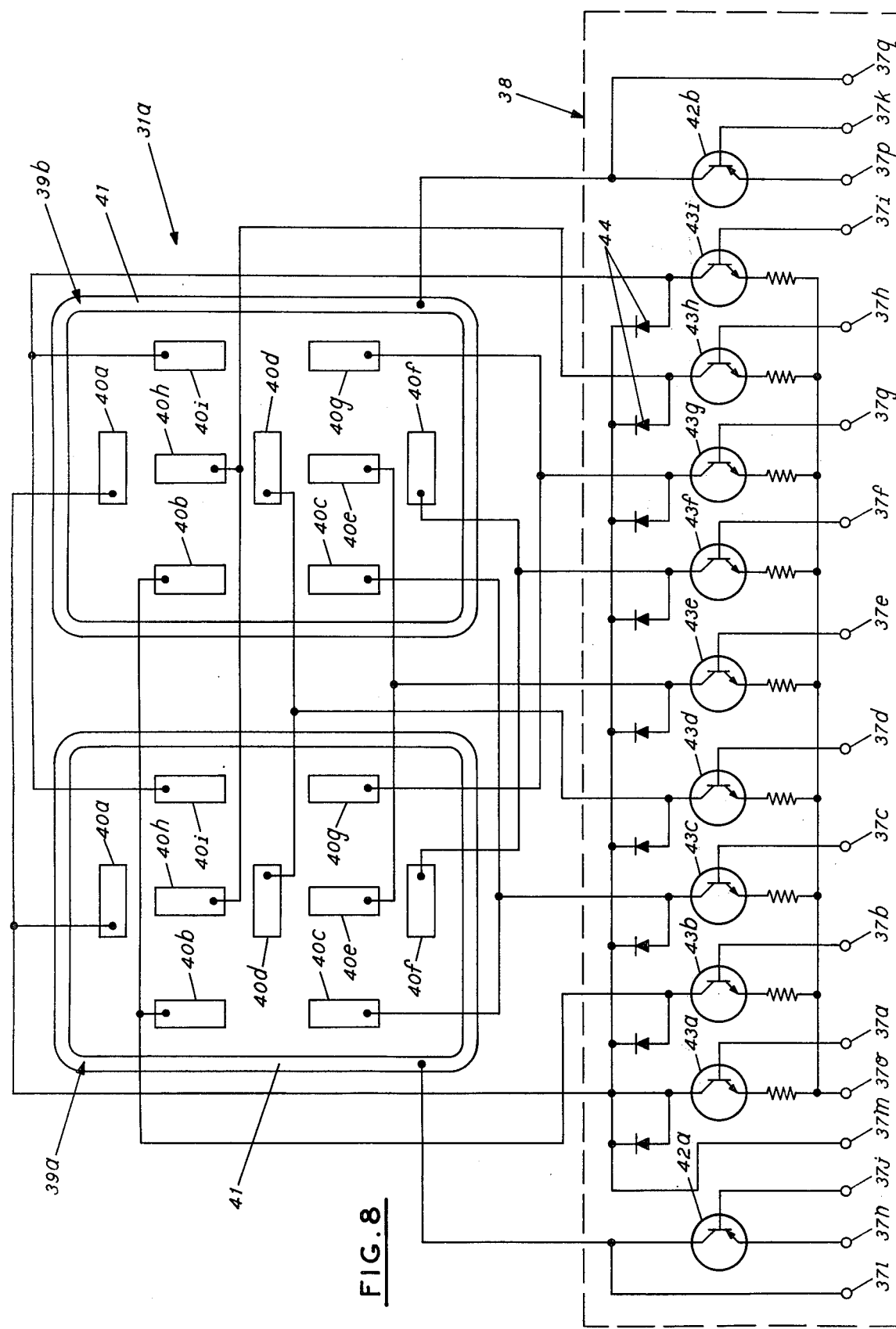
FIG. 8 is a further schematic of the digital controller-decoder of FIG. 7.

FIG. 8 illustrates, in more detail, switch energization circuit 38 and its operation in conjunction with a specific typical luminescence planar discharge unit 31a of indicating unit 17 of FIG. 1.

As shown in FIG. 8, planar luminescence discharge unit 31a is composed of side-by-side semiconductor subassemblies 39a and 39b positioned within a common transparent envelope on a common insulating base plate. Each subassembly 39a, 39b is composed of an array of fluorescent, semiconductor cathode segments 40a, 40b, 40c, 40d, 40e, 40f, 40g, 40h, 40i, arranged in a split figure eight, or cross of stacked squares, configuration. Similarly noted individual segments of each cathode array are linked to each other and thence to common terminals 37a–37i, respectively, within switch energization circuit 38.

Anode segments 41 surround the edges of selected cathode segments and are controlled by signals passing by way of terminals 37j and 37k, as explained below so as to provide two functions: as a barrier between the adjacent subassemblies and as an anode to provide ion generation with selected cathode segments. As is well known, the cathode and anode segments of each subassembly are supported on the flat common insulating base plate (not shown) whereby flared edges of the latter can contact a transparent front plate to form the common envelope for these subassemblies. A rare ionizable gas such as neon resides within the envelope. Correct voltage conditions are provided to anode and cathode segments as by way of terminals 37l–37q through cooperation operation of the digital controller decoder 28 (FIG. 7) in conjunction with supply means 30 so as to provide discharge fluorescent characteristics. That is, ions are generated via ionization of the surrounding gas between selected elements, such ions subsequently impinging on the fluorescent segments to activate the latter in the desired pattern of luminescence corresponding to the alphanumeric indicia for which display is sought.

Referring again to FIG. 8, switch energization circuit 38 is seen to include anode switching transistors 42a and 42b associated with anode segments 41, and a plurality of cathode switching transistors 43a–43i. The latter are seen to be in shunt with diodes 44.

Operation of the switch energization circuit 38 and planar luminescence discharge units 31a, 31b and 31c will now be explained with reference to FIGS. 7 and 8. For simplicity of discussion, assume that the alphanumerical indicia for the planar luminescence discharge units 31a, 31b and 31c of FIG. 7 have been selected. Also assume that the outputs of buffer-driver 36 are such as to operate each planar luminescence discharge unit in a luminescent discharge mode whereby the luminescence discharge units are first caused to discharge so as to create ions, such ions then impinging upon the fluorescent cathode segments, so as to activate the latter projecting luminescence therefrom. The frequency of repetition of the units, of course, should be high enough to provide a solid image to the observer of each gas discharge unit. In this regard the retinal persistence of the human eye must be taken into account. The repetition frequency between segments at anode terminals 37j and 37k should therefore not be less than 30 cycles per second, with about 60 cycles per second being preferred.

the fluorescent discharge pattern between anode and selected cathode segments is a function the binary activation code at terminals 37a–37k of FIG. 8. In general, when the anode segments are functioning in the conventional anode mode, activation pulses appear at switching transistors 42a and 42b. These transistors are enabled whereby at terminals 37m and 37p, first positive voltage bias signal generated by supply means 30 of FIG. 7 appears and is sensed by the anode segments 42. On the other hand, when acting in a ion barrier mode, the anode segments 41 are not biased at terminals 37m and 37p (the transistors 42a and 42b, are in a disabled condition) but, instead, they are biased by signals appearing at terminals 37l and 37g. The resulting bias voltage has an amplitude less than that of the first-mentioned bias signal.

The cathode segments 40a–40i function in a similar manner. When activation pulses appear at terminals 37a–37i, switching transistors 43a–43i are biased to an ON state; corresponding cathode segments are supplied with ground potential via terminal 37o. However, when the transistors 43a–43i are biased off, the cathode segments are yet provided with another bias voltage via terminal 37m generated in conjunction with diodes 44.

It is apparent that permitting the anode segments 41 of the subassemblies 38a and 39b to function as either barriers or as conventional anodes provides enhanced resolution of the corresponding luminescent discharge unit whereby resulting light pattern corresponding to the alphanumeric indicia sought to be displayed is much improved.

Figure 3:
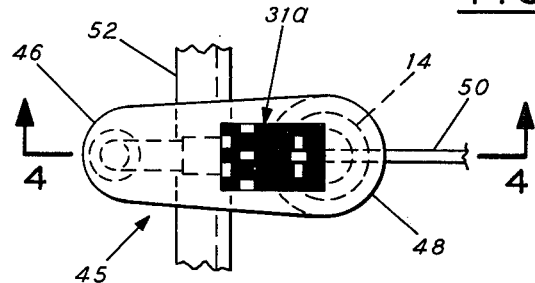
FIG. 3 is a plan view of a tab frame means attached to a selected key button of the typewriter console of FIG. 1.
Figure 4:
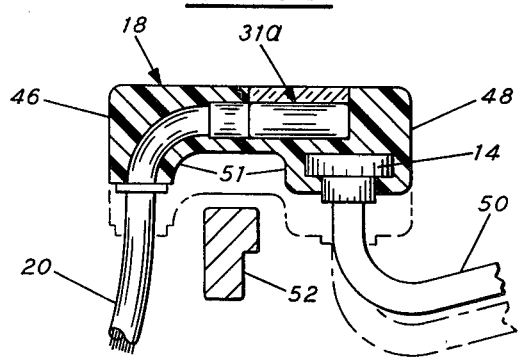
FIG. 4 is a section taken along line 4—4 of FIG. 3.

Support of the planar luminescent discharge unit 31a adjacent to a key button 14 is best illustrated with reference to FIGS. 3 and 4.

As previously described, transfer bundle means 20 is composed of sets of conductors; they connect to the input terminals of cathode and anode segments comprising the dischage unit 31a in the manner previously described. Support of the discharge unit 31a is through the rigid frame means 18 previously mentioned.

Frame means 18 includes a cantilevered end 46 and a support end 48. The support end 48 attaches to a selected key button 14 as shown in FIG. 4. Over the central region the frame 18 there is a reduction in thickness to form steps 51. In that way when the keyboard button 14 is depressed whereby key lever 50 is likewise downwardly depressed, there is sufficient clearance of these elements with regard to lip 52 of the typewriter housing 13.

The gas luminescent display unit 31a is arranged to provide a 2-character, side-by-side display at or adjacent to each key button 14. Since the resulting 2-character, alphanumeric display is illuminated by light, the observer-user can easily observe the displayed character irrespective of the background lighting at the computer terminal.

Since the planar luminescent display units 31a, 31b and 31c of FIG. 7 operate as fluorescent light generators, perhaps a brief discussion of the principles of fluorescent emission, may be instructive.

Fluorescent emission can be incorporated in two separate operating modes for use in the apparatus of the present invention. For example, in a vacuum fluorescent tube, a plurality of anodes, say seven segments, can be arranged in a standard figure eight configuration adjacent to a filament placed between the viewer and the anodes. The anodes are each coated with a phosphor. The thermal electron filament is heated just below incandescence. Glow of selected anodes in a desired pattern is a result of electron bombardment.

Furthermore, semiconductor devices using fluorescent materials can also be used as fluorescent light generators in the manner previously discussed. For example, with reference to FIG. 8, an ion discharge, fluorescent display can be particularly efficiently presented in the illustrated embodiment where anode segment means 41 are operated in two modes: as anodes or as barriers. In such an embodiment, no heating filament is required; a common insulated base plate is used upon which a planar array of cathode segments 40a–40i of fluorescent materials, say zinc oxide, is formed. The cathode segments 40a–40i are in a standard planar form, say a crossed figure eight, and are positioned adjacent to anode-barrier means 41 also disposed upon the insulating plate coplanar with the cathode segments. As the latter are biased, ions impinging thereon create a pattern of fluoresence corresponding to the alphanumeric indicium sought to be displayed.

However, another semiconductor embodiment utilizing a thermal electron producing filament in vacuo positioned adjacent to a planar array of fluorescent segments layed down on an insulated base plate, may be useful in some applications. Suffice to say that fluorescent materials in addition to the previously mentioned zinc oxide are readily available. Also, suitable substrate insulating plate materials are readily known including ceramics and like materials.

While certain preferred embodiments of the invention have been specifically disclosed, it should be understood that the invention is not limited thereto. For example, if the dimensions of each luminescent gas discharge unit are reduced, the supporting housing within each key button 14 may be sufficient to support the former. In such an arrangement, a selected key button 14 would be provided with a bore which would then accept a planar luminescent gas discharge display unit. The resulting display would be directly viewable by the observer-user. Accordingly, as many variations will be readily apparent by those skilled in the art, the invention should be given as broad as possible interpretation in terms of the following claims.

I claim:

1. A device for displaying alphanumeric light-emanating indicia at selected key buttons of a keyboard of a typewriter console forming an I/O link with a general purpose digital computer, each light-emanating alphanumeric indicium being related to a font operational characteristic resulting from movement of one of said selected key buttons under control of a human observer-user whereby said font operational characteristic is permanently recorded on paper at said typewriter console in full view of said human observer-user through mechanical button-font-paper interaction, comprising:

a. a set of luminescent indicator means positioned at or adjacent to said selected key buttons, each of said set of luminescent indicator means comprising an elongated insulated base plate surrounded by transparent envelope means, anode means attached to said insulated plate and an array of separately-energizable fluorescent cathode segments arranged in a selected configuration on a common side of said insulated plate adjacent to said anode means;

b. elongated rigid cantilevered frame means attached to and supportive of each of said indicator means, said frame means including cooperative gripping means in contact with a corresponding key button of said keyboard;

c. controller switch means connected to said set of indicator means and including cooperative means for energizing selected cathode segments and anode means of at least one of said each indicator means so as to provide fluorescent glow therefrom in a pattern corresponding to said alphanumeric display indicia for which display is sought, said alphanumeric indicia also being of sufficient intensity so as to be easily discernible to said human observer-user using said typewriter console irrespective of the background lighting environment thereabout.

2. Device of claim 1 in which each of said luminescent indicating means is supported interior of said one key button of said keyboard, said indicating means being viewable at the finger-touching surface of said one key button.

* * * * *